(12) United States Patent
Yoo et al.

(10) Patent No.: US 10,553,625 B2
(45) Date of Patent: Feb. 4, 2020

(54) METHOD OF MANUFACTURING DISPLAY DEVICE INCLUDING MULTILAYERED LINES ARRANGED AT FINE INTERVALS (71) Applicant: SAMSUNG DISPLAY CO., LTD., Yongin-si, Gyeonggi-Do (KR)

(72) Inventors: In Kyung Yoo, Yongin-si (KR); Chong Sup Chang, Yongin-si (KR); Dong Hyun Yang, Yongin-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 0 days.

(21) Appl. No.: 16/026,742

(22) Filed: Jul. 3, 2018

(65) Prior Publication Data
US 2019/0198535 A1   Jun. 27, 2019

(30) Foreign Application Priority Data

Dec. 27, 2017 (KR) .................. 10-2017-0181007

(51) Int. Cl.
*H01L 21/32* (2006.01)
*H01L 27/12* (2006.01)
*H01L 21/3213* (2006.01)

(52) U.S. Cl.
CPC .... *H01L 27/1288* (2013.01); *H01L 21/32139* (2013.01)

(58) Field of Classification Search
CPC .............. H01L 27/1288; H01L 21/32139
USPC ....................................... 438/669
See application file for complete search history.

(56) References Cited

U.S. PATENT DOCUMENTS

| 7,545,463 | B2 | 6/2009 | Park | |
| 7,615,336 | B2* | 11/2009 | Lee | G03F 1/32 |
| | | | | 430/313 |
| 7,638,373 | B2 | 12/2009 | Heo et al. | |
| 9,268,168 | B2 | 2/2016 | Yi et al. | |
| 2004/0263706 | A1* | 12/2004 | Cho | G02F 1/136286 |
| | | | | 349/43 |
| 2005/0157237 | A1* | 7/2005 | Doi | G02F 1/133553 |
| | | | | 349/139 |
| 2008/0003728 | A1* | 1/2008 | Hwang | H01L 27/1214 |
| | | | | 438/151 |
| 2014/0028944 | A1* | 1/2014 | Kanzaki | G02F 1/1368 |
| | | | | 349/46 |

(Continued)

FOREIGN PATENT DOCUMENTS

| KR | 10-0479960 | 3/2005 |
| KR | 10-0909139 | 7/2009 |

(Continued)

*Primary Examiner* — Didarul A Mazumder
(74) *Attorney, Agent, or Firm* — F. Chau & Associates, LLC (57) ABSTRACT A method of manufacturing a display device, includes providing a substrate including a first stepped part, forming a metal layer on the substrate and the first stepped part, forming an organic layer pattern on the metal layer at a position corresponding to a sidewall of the stepped part, forming a photosensitive layer on the metal layer and the organic layer pattern, patterning the photosensitive layer to form a photosensitive layer pattern adjacent to the organic layer pattern, and forming a metal line by removing the organic layer pattern and an exposed portion of the metal layer through an etching process using the photosensitive layer pattern as a mask.

20 Claims, 4 Drawing Sheets

(56) References Cited

U.S. PATENT DOCUMENTS

| | | | | |
|---|---|---|---|---|
| 2015/0024530 A1* | 1/2015 | Lee | ................... | H01L 29/66477 |
| | | | | 438/34 |
| 2015/0084035 A1* | 3/2015 | Kim | ................. | H01L 29/78606 |
| | | | | 257/43 |
| 2015/0179687 A1* | 6/2015 | Lee | .................... | H01L 29/4908 |
| | | | | 438/158 |
| 2015/0243681 A1* | 8/2015 | Sung | ................... | H01L 27/1288 |
| | | | | 257/72 |
| 2016/0012782 A1* | 1/2016 | Suzumura | ......... | G02F 1/133345 |
| | | | | 345/206 |
| 2016/0372581 A1* | 12/2016 | Song | ................ | H01L 21/02565 |

FOREIGN PATENT DOCUMENTS

| KR | 10-0930920 | 12/2009 |
|---|---|---|
| KR | 10-2014-0091397 | 7/2014 |
| KR | 10-1431136 | 8/2014 |
| KR | 10-2015-0057850 | 5/2015 |

* cited by examiner

METHOD OF MANUFACTURING DISPLAY DEVICE INCLUDING MULTILAYERED LINES ARRANGED AT FINE INTERVALS

CROSS-REFERENCE TO RELATED APPLICATION

The present application claims priority under 35 U.S.C. § 119 to Korean patent application number 10-2017-0181007 filed on Dec. 27, 2017, the disclosure of which is incorporated by reference herein in its entirety.

TECHNICAL FIELD

Exemplary embodiments of the present inventive concept relate to a method of manufacturing a display device, and more particularly, to a method of manufacturing a display device including multilayered lines arranged at fine intervals.

DISCUSSION OF THE RELATED ART

Flat panel display devices such as a liquid crystal display (LCD) device and an organic light emitting diode (OLED) display device are relatively thin and light in weight. Therefore, the range of application of the flat panel display devices is expanding.

Recently, to meet the desires of users, thinner and higher-resolution flat panel displays have been under development.

SUMMARY

According to an exemplary embodiment of the present inventive concept, a method of manufacturing a display device, includes providing a substrate including a first stepped part, forming a metal layer on the substrate and the first stepped part, forming an organic layer pattern on the metal layer at a position corresponding to a sidewall of the first stepped part, forming a photosensitive layer on the metal layer and the organic layer pattern, patterning the photosensitive layer to form a photosensitive layer pattern adjacent to the organic layer pattern, and forming a metal line by removing the organic layer pattern and an exposed portion of the metal layer through an etching process using the photosensitive layer pattern as a mask.

In an exemplary embodiment of the present inventive concept, the first stepped part has a height of about 2000 Å or more.

In an exemplary embodiment of the present inventive concept, the method further includes forming an insulating layer on the substrate and the first stepped part, and forming the metal layer on the insulating layer.

In an exemplary embodiment of the present inventive concept, the organic layer pattern includes a colored dye or pigment.

In an exemplary embodiment of the present inventive concept, the organic layer pattern has a reflectivity ranging from about 1% to about 30%.

In an exemplary embodiment of the present inventive concept, the metal line is formed to have a width of about 2 μm or less.

According to an exemplary embodiment of the present inventive concept, a method of manufacturing a display device includes providing a substrate, and forming a plurality of patterns on the substrate such that a plurality of steps is formed on a surface of the substrate. Each of the patterns is spaced apart from each other by a predetermined distance. The method further includes forming a metal layer on the substrate and the plurality of patterns, forming a plurality of organic layer patterns on the metal layer at positions corresponding to sidewalls of the plurality of patterns, forming a photosensitive layer on the metal layer and the plurality of organic layer patterns, patterning the photosensitive layer to form a photosensitive layer pattern between the plurality of organic layer patterns, and forming a plurality of metal lines by removing the organic layer patterns and exposed portions of the metal layer through an etching process using the photosensitive layer pattern as a mask.

In an exemplary embodiment of the present inventive concept, each of the plurality of patterns has a height of about 2000 Å or more, and the predetermined distance between the plurality of patterns is about 5 μm or less.

In an exemplary embodiment of the present inventive concept, the method further includes forming an insulating layer on the substrate and the plurality of patterns, and forming the metal layer on the insulating layer.

In an exemplary embodiment of the present inventive concept, the organic layer pattern includes a colored dye or pigment.

In an exemplary embodiment of the present inventive concept, the organic layer pattern has a reflectivity ranging from about 1% to about 30%.

In an exemplary embodiment of the present inventive concept, the metal line is formed to have a width of about 2 μm or less.

According to an exemplary embodiment of the present inventive concept, a method of manufacturing a display device includes providing a substrate including a plurality of stepped parts. Each stepped part includes sidewalls that are slanted. The method further includes forming a first insulating layer on the substrate and the plurality of stepped parts, forming a metal layer on the first insulating layer, and forming an organic layer pattern on the metal layer. The organic layer pattern overlaps the sidewalls of the plurality of stepped parts that are slanted. The method further includes forming a photosensitive layer on the metal layer, patterning the photosensitive layer to form a photosensitive layer pattern and to expose a portion of the metal layer, and forming a metal line by removing the organic layer pattern and the exposed portion of the metal layer.

In an exemplary embodiment of the present inventive concept, the plurality of stepped parts includes a first stepped part and a second stepped part adjacent to the first stepped part, and the photosensitive layer pattern is formed between the first and second stepped parts.

In an exemplary embodiment of the present inventive concept, the photosensitive layer pattern is formed between sidewalls of the first and second stepped parts that are overlapped by the organic layer pattern.

In an exemplary embodiment of the present inventive concept, the organic layer pattern and the exposed portion of the metal layer are removed through an etching process by using the photosensitive layer pattern as a mask.

In an exemplary embodiment of the present inventive concept, the plurality of stepped parts includes a first stepped part and a second stepped part adjacent to the first stepped part, and the first stepped part and the second stepped are spaced apart from each other by a predetermined distance.

In an exemplary embodiment of the present inventive concept, the predetermined distance between the first stepped part and the second stepped part is about 5 μm or less.

In an exemplary embodiment of the present inventive concept, the metal line is formed to have a width of about 2 μm or less.

In an exemplary embodiment of the present inventive concept, the organic layer pattern has a reflectivity of about 30% or less.

BRIEF DESCRIPTION OF THE DRAWINGS

A more complete appreciation of the present disclosure and many of the attendant aspects thereof will be readily obtained as the same becomes better understood by reference to the following detailed description when considered in connection with the accompanying drawing, wherein.

DETAILED DESCRIPTION OF THE EMBODIMENTS

Exemplary embodiments of the present inventive concept will be described more fully hereinafter with reference to the accompanying drawings. In the drawings, lengths and sizes of layers and regions may be exaggerated for clarity. For example, since sizes and thicknesses of components in the drawings may be exaggerated for clarity, the following exemplary embodiments of the present inventive concept are not limited thereto. Like reference numerals in the drawings may denote like elements.

Terms such as "first" and "second" may be used to describe various components, but they should not limit the various components. Those terms are only used to differentiate a component from other components. For example, a first component may be referred to as a second component, and a second component may be referred to as a first component and so forth without departing from the spirit and scope of the present inventive concept.

It will be understood that when an element is referred to as being "connected" or "coupled" to another element, the element may be directly connected or coupled to the other element or intervening elements.

Figure 1:
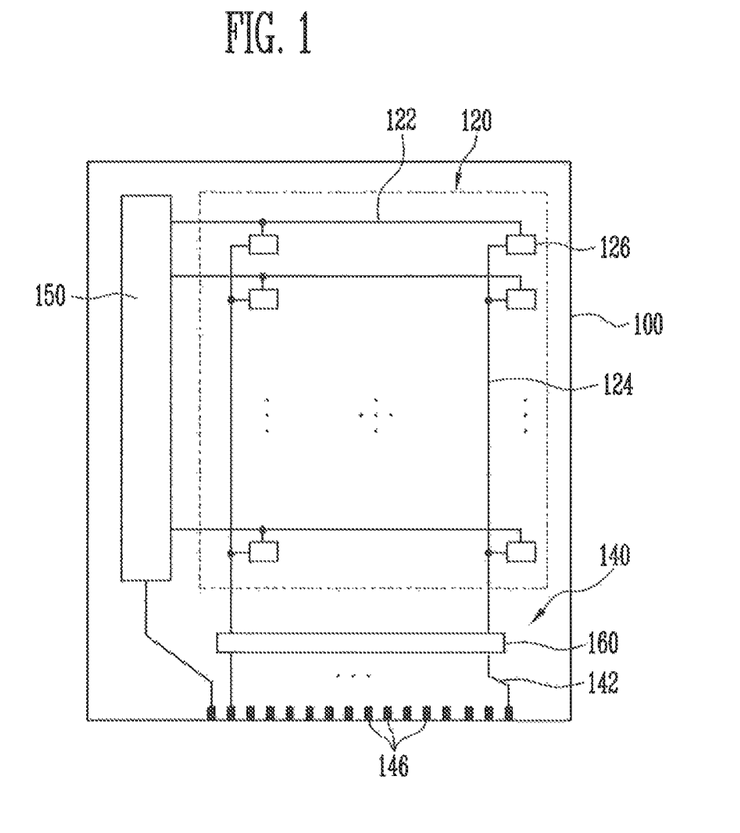
FIG. 1 is a plan view illustrating a display device according to an exemplary embodiment of the present inventive concept.

FIG. 1 is a plan view illustrating a display device according to an exemplary embodiment of the present inventive concept.

Referring to FIG. 1, the display device may be formed on a substrate 100.

The substrate 100 may include a display region 120 on which an image may be displayed, and a non-display region 140 formed around the display region 120. The non-display region 140 may be formed to at least partially enclose the display region 120.

The display region 120 may include a plurality of scan lines 12.2 arranged in a first direction, a plurality of data lines 124 arranged in a second direction intersecting the first direction, and a plurality of pixels 126 coupled to the scan lines 122 and the data lines 124.

The non-display region 140 may include a scan driver 150 configured to provide scan signals to the scan lines 122, a data driver 160 configured to provide data signals to the data lines 124, and a pad unit 146 electrically coupled to the scan driver 150 and the data driver 160 through lines 142.

The pad unit 146 may be disposed in the non-display region 140 to receive a signal from an external device. For example, the pad unit 146 may be disposed adjacent to the data driver 160. However, the present inventive concept is not limited thereto.

The display device may include a controller. For example, the controller may be connected to the pad unit 146, and the controller may receive an image signal from the external device, generate a data signal, and provide the data signal to the data driver 160. As an additional example, the controller may receive a synchronization signal and a clock signal from the external device, generate control signals, and provide the control signals to the scan driver 150 and the data driver 160.

Figure 2:
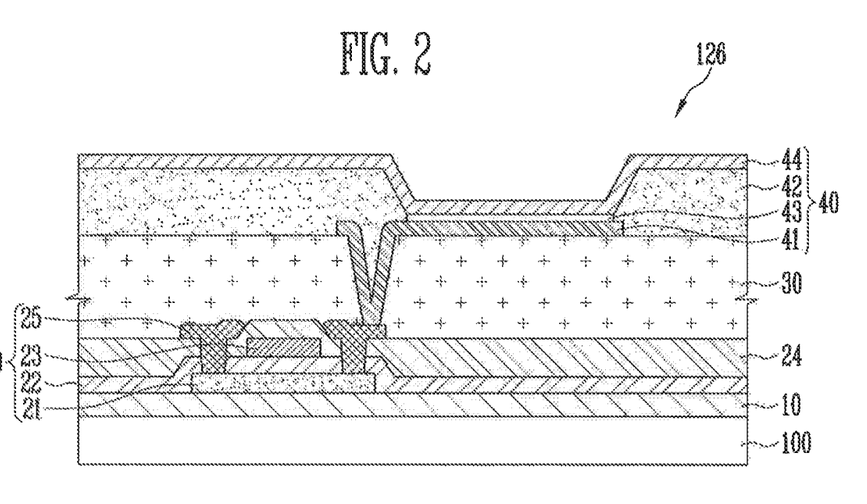
FIG. 2 is a cross-sectional view illustrating a pixel shown in FIG. 1 according to an exemplary embodiment of the present inventive concept.

FIG. 2 is a schematic cross-sectional view illustrating a pixel 126 shown in FIG. 1 according to an exemplary embodiment of the present inventive concept.

Referring to FIG. 2, each of the pixels 126 includes an emission element 40, and a pixel circuit configured to drive the emission element 40. The pixel circuit may include a thin-film transistor 20 configured to transmit a signal to the emission element 40, and a capacitor configured to retain the signal. For example, the thin-film transistor 20 may transmit a signal to the emission element 40 in response to a scan signal from the scan driver 150.

Current flowing through the emission element 40 is controlled in response to a data signal provided from the corresponding data line 124, whereby the pixel 126 may emit light having a predetermined luminance corresponding to the received data signal.

The emission element 40 may include, for example, an organic light emitting diode (OLED).

The emission element 40 may include a first electrode 41, a second electrode 44, and an organic thin-film layer 43 interposed between the first electrode 41 and the second electrode 44.

The thin-film transistor 20 includes a semiconductor layer 21 configured to provide source and drain regions and a channel region, a gate electrode 23 disposed on the channel region of the semiconductor layer 21, and source and drain electrodes 25 electrically coupled to the source and drain regions of the semiconductor layer 21, respectively.

For instance, the pixel 126 may be manufactured as follows.

Referring to FIG. 2, a buffer layer 10 is formed on the substrate 100.

The buffer layer 10 may block a foreign substance, moisture, external air or other impurities from permeating the pixel 126 from below (e.g., from the substrate 100), and may be formed of, for example, silicon oxide, silicon nitride, silicon oxynitride, or the like.

The semiconductor layer 21 for providing the source and drain regions and the channel region may be formed on the buffer layer 10.

The semiconductor layer 21 may be formed of, for example, amorphous silicon, polysilicon, an oxide semiconductor, or the like.

The gate electrode 23 is formed over the channel region of the semiconductor layer 21 such that the gate electrode 23 is insulated from the semiconductor layer 21 by a gate insulating layer 22.

During the process of forming the gate electrode 23, the scan lines 122, the lines 142, and the pad unit 146 may be formed.

An interlayer insulating layer 24 may be formed on the gate insulating layer 22 and the gate electrode 23. Contact holes are formed in the interlayer insulating layer 24 and the gate insulating layer 22 so that the source and drain regions of the semiconductor layer 21 are exposed through the contact holes. The source and drain electrodes 25 are formed on the interlayer insulating layer 24 such that the source and drain electrodes 25 are coupled to the source and drain regions of the semiconductor layer 21 through the contact holes.

During the process of forming the source and drain electrodes 25, the data lines 124, the lines 142, and the pad unit 146 may be formed.

A planarization layer 30 is formed on the thin-film transistor 20 having the above-mentioned configuration.

A via hole is formed in the planarization layer 30 so that the source or drain electrode 25 is exposed through the via hole. A first electrode 41, e.g., as an anode electrode, is formed on the planarization layer 30 such that the first electrode 41 may be coupled to the source or drain electrode 25 through the via hole.

The first electrode 41 may include a reflective layer including, for example, Ag, Mg, Al, Pt, Pd, Au, Ni, Nd, Ir, and/or Cr, or an alloy of the metals. The first electrode 41 may further include a transparent or semitransparent conductive layer formed on the reflective layer. The transparent or semitransparent conductive layer may include, for example, indium tin oxide (ITO), indium zinc oxide (IZO), zinc oxide (ZnO), indium oxide ($In_2O_3$), indium gallium oxide (IGO), and/or aluminum zinc oxide (AZO).

After a pixel defining layer 42 has been formed on the planarization layer 30 and the first electrode 41, an opening is formed by patterning the pixel defining layer 42 such that a portion of the first electrode 41 that corresponds to an emission region is exposed through the opening. The organic thin-film layer 43 is formed on the portion of the first electrode 41 that corresponds to the opening.

The organic thin-film layer 43 may include a hole injection layer, a hole transport layer, an organic emission layer, an electron transport layer, and an electron injection layer. The organic thin-film layer 43 may further include, for example, an auxiliary layer or an intermediate layer.

A second electrode 44, e.g., as a cathode electrode, is formed on the pixel defining layer 42 and the organic thin-film layer 43. For example, the second electrode 44 may overlap the organic thin-film layer 43 and the first electrode 41.

The second electrode 44 may be a transparent or semitransparent electrode, and be made of metal that has a low work function and includes, for example, Li, Ca, LiF/Ca, LiF/Al, Al, Ag, Mg, and/or a compound thereof.

After a protective layer is formed on the emission element 40 to protect the emission element 40 having the above-mentioned configuration from external air, an encapsulation layer may be formed on the protective layer.

In an exemplary embodiment of the present inventive concept, although the OLED display device has been described by way of example, the display device may be embodied into a liquid crystal display device.

FIGS. 3A to 3F are cross-sectional views illustrating a method of manufacturing a display device according to an exemplary embodiment of the present inventive concept.

Figure 3A:
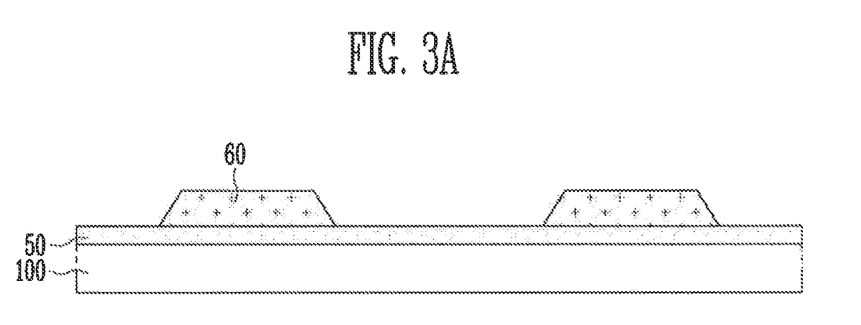
FIGS. 3A to 3F are cross-sectional views illustrating a method of manufacturing a display device according to an exemplary embodiment of the present inventive concept.

Referring to FIG. 3A, a substrate 100 including at least one stepped part 60 is provided.

The stepped part 60 may have a three-dimensional structure including at least one sidewall and an upper surface. Due to the stepped part 60, the substrate 100 may have an uneven surface with a step difference. For example, the substrate 100 may have a surface with different heights.

The stepped part 60 may be a conductive pattern, to be formed of a polysilicon layer or a metal layer during the process of manufacturing the display device, and may be an electrode or a line. For example, the stepped part 60 may be formed on the substrate 100 by forming a plurality of conductive patterns on the substrate 100 with a predetermined distance between each conductive pattern.

The stepped part 60 may have a height of about 2000 Å or more,

As shown in FIG. 3A, in the case where a plurality of stepped parts 60 are provided, the distance between the stepped parts 60 may be about 5 μm or less.

In an exemplary embodiment of the present inventive concept, the stepped part 60 may be disposed on the substrate 100, and a first insulating layer 50 may be provided between the stepped part 60 and the substrate 100.

The substrate 100 may be formed of, for example, a semiconductor, glass, quartz, metal, plastic, etc.

The first insulating layer 50 may be made of an inorganic material, e.g., silicon oxide, silicon nitride, or silicon oxynitride.

Figure 3B:
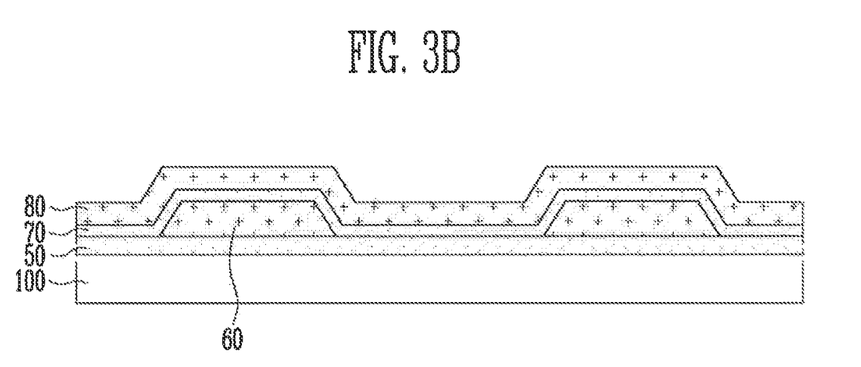

Referring to FIG. 3B, a second insulating layer 70 and a metal layer 80 may be successively formed on the first insulating layer 50 and the stepped part 60.

The second insulating layer 70 may be made of an inorganic material or an organic material.

The metal layer 80 may include, for example, Ag, Mg, Ti, Al, Pt, Pd, Au, Ni, Nd, Ir, and/or Cr, and/or an alloy thereof.

Figure 3C:
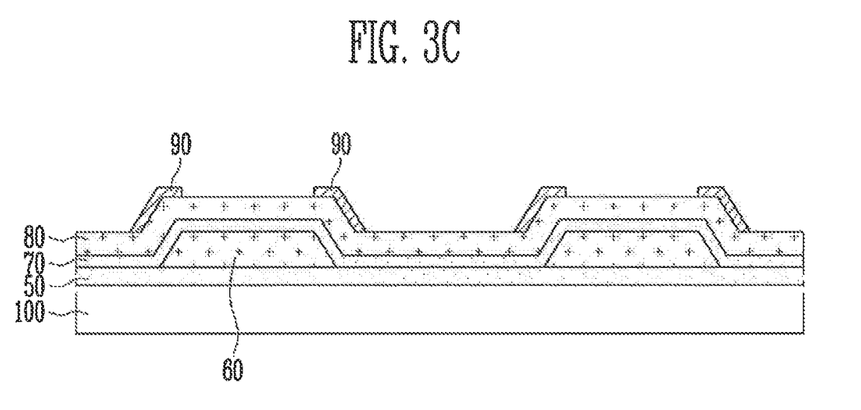

Referring to FIG. 3C, an organic layer pattern 90 is formed on the metal layer 80 at a position corresponding to each sidewall of the stepped part 60. For example, the organic layer pattern 90 may be formed on a portion of the metal layer 80 that corresponds to a slant of each sidewall of the stepped part 60.

For example, after an organic layer and a photosensitive layer are successively formed on the metal layer 80, a photosensitive layer pattern is formed by patterning the photosensitive layer through exposure and development processes using a mask. Thereafter, the organic layer pattern 90 may be formed by etching an exposed portion of the organic layer through an etching process using the photosensitive layer pattern as a mask.

For example, the organic layer pattern 90 may be formed by applying an organic layer to the metal layer 80 using an inkjet printing method or the like.

The organic layer pattern 90 may include a colored dye or pigment.

The organic layer pattern 90 may be formed of one organic material or one or more organic materials including, for example, polyethersulphone (PES), polyacrylate (PAR), polyether imide (PEI), polyethylene napthalate (PEN), polyethyleneteterepthalate (PET), polyphenylene sulfide (PPS), polyallylate, polyimide, acryl, polyimide, and benzocyclobutene. Carbon black, perylene black, black titanium oxide, titanium dioxide, perynone, coumarine, and/or other fused aromatic cyclic compounds may be included as the colored dye or pigment in the organic layer pattern 90.

Materials for forming the organic layer pattern 90 are not limited to the above examples. For example, the organic layer pattern 90 may include material that is used as the organic thin-film layer or a black matrix in the display device, or material having a component similar to that of the photosensitive layer.

In an exemplary embodiment of the present inventive concept, the organic layer pattern 90 may have a reflectivity of about 30% or less. In an exemplary embodiment of the present inventive concept, the organic layer pattern 90 may have a reflectivity ranging from approximately 1% to approximately 30%. In an exemplary embodiment of the present inventive concept, the organic layer pattern 90 may have a reflectivity ranging from approximately 1% to approximately 3%.

If the reflectivity of the organic layer pattern 90 is 30% or more, it may be difficult to obtain the effect of preventing diffused reflection. In the case of an organic layer pattern having a reflectivity of 1% or less, it may be difficult to manufacture the organic layer pattern.

For example, the reflectivity of the organic layer pattern 90 may be adjusted by adding an appropriate amount of dye or pigment, while taking the inherent reflectivity of the organic material into account.

Figure 3D:
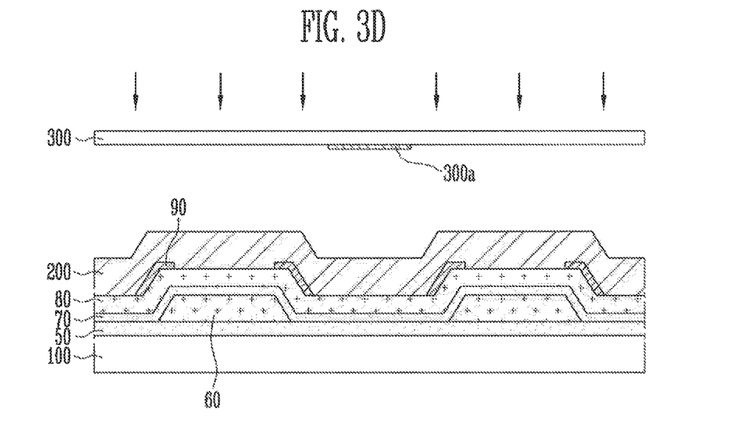

Referring to FIG. 3D, a photosensitive layer 200 is formed on the metal layer 80 and the organic layer pattern 90.

The photosensitive layer 200 is exposed using a mask 300 including a predetermined light shielding pattern 300a. The light shielding pattern 300a may have a shape corresponding to an electrode or a line to be formed.

Figure 3E:
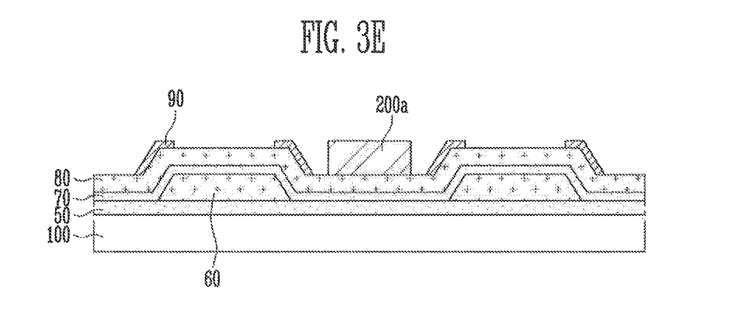

Referring to FIG. 3E, the photosensitive layer 200 is developed. The exposed portion of the photosensitive layer 200 is removed through the development process. As a result, a photosensitive layer pattern 200a corresponding to the light shielding pattern 300a may be formed between the corresponding organic layer patterns 90.

Figure 3F:
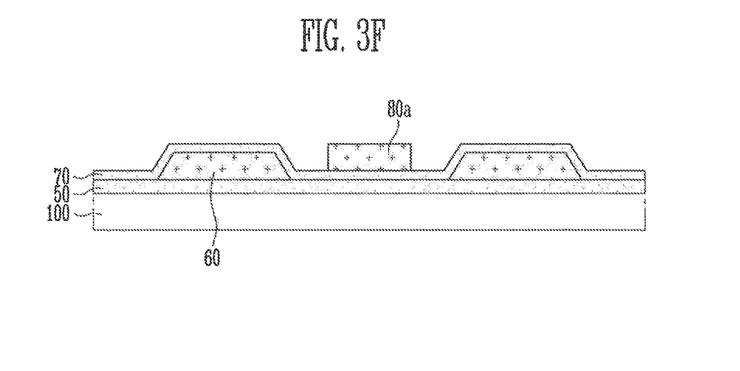

Referring to FIG. 3F, a metal line 80a is formed on the second insulating layer 70 between the stepped parts 60 by removing the organic layer patterns 90 and the exposed portion of the metal layer 80 through an etching process using the photosensitive layer pattern 200a as a mask.

The etching process for removing the organic layer patterns 90 and the metal layer 80 may be performed in a dry etching scheme or a wet etching scheme. A plasma etching process may be used as the dry etching process. An etching process using etchant appropriate for the kind of metal may be used as the wet etching process.

The organic layer patterns 90 and the metal layer 80 may be successively removed through respective etching processes, or, simultaneously removed through a single etching process.

In an exemplary embodiment of the present inventive concept, in the case where the organic layer patterns 90 are formed of an organic layer having material similar to that of the photosensitive layer 200, the organic layer patterns 90 may be removed along with the corresponding portion of the photosensitive layer 200 during the process of developing the photosensitive layer 200.

The higher the resolution of the display device, the higher the density of the electrodes or the lines may be. Furthermore, the electrodes or the lines may have a multilayered structure.

In an exemplary embodiment of the present inventive concept, the stepped part 60 may be a lower line to be formed on the non-display region 140 of the substrate 100 during a process of forming the gate electrode 23 of the thin-film transistor 20. The metal line 80a may be an upper line to be formed on the non-display region 140 of the substrate 100 during a process of forming the source and drain electrodes 25 of the thin-film transistor 20.

Figure 4A:
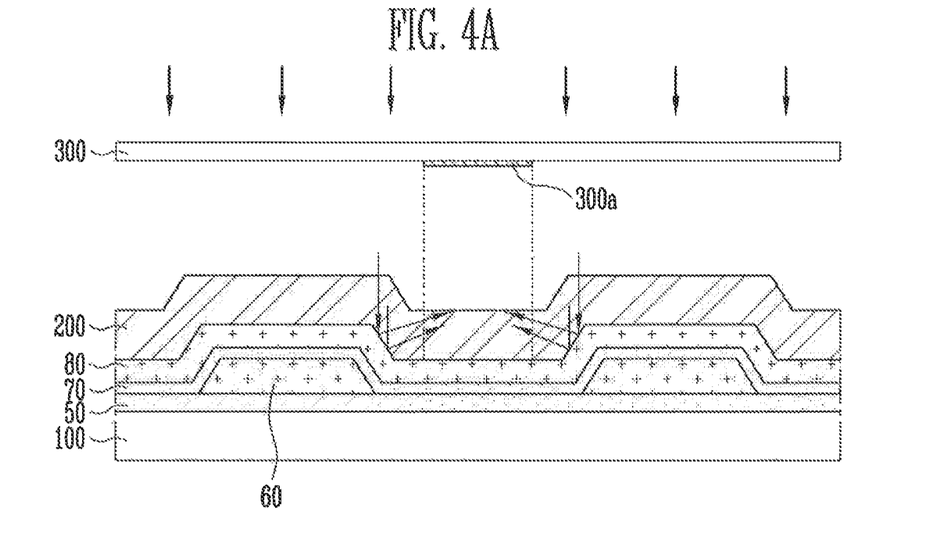
FIGS. 4A to 4C are cross-sectional views illustrating a comparative exemplary embodiment of the present inventive concept.
Figure 4B:
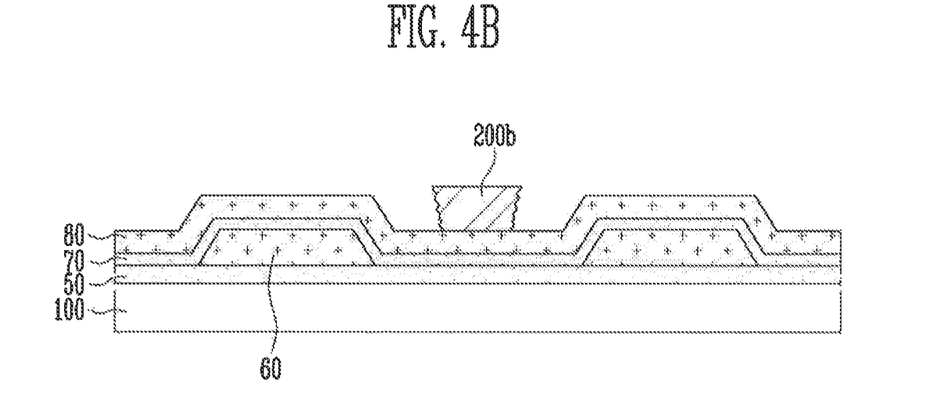
Figure 4C:
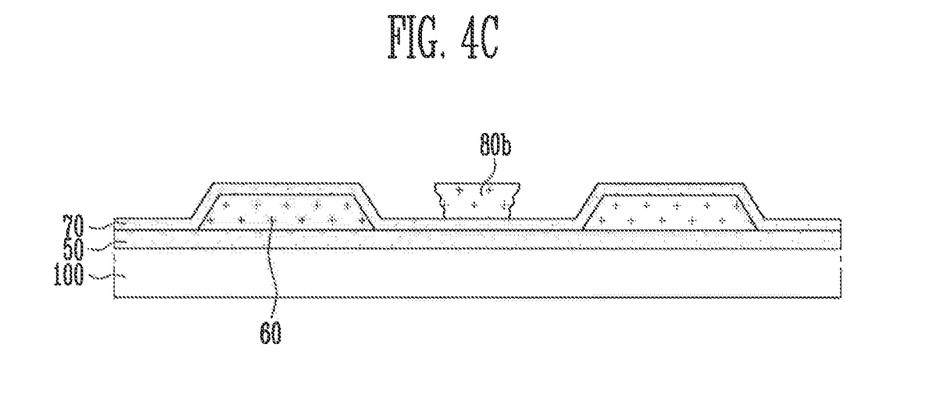

FIGS. 4A to 4C are cross-sectional views illustrating a comparative exemplary embodiment of the present inventive concept.

Referring to FIG. 4A, for example, in the ease where each stepped part 60 has a height of about 2000 Å or more and the distance between the stepped parts 60 is about 5 μm or less, a lower step difference due to the height of each stepped part 60 and the distance between the stepped parts 60 may also be revealed on the surface of the metal layer 80.

In this state, if the exposure process is performed, diffused reflection may be caused, particularly, on ramps (or, e.g., slants) of the metal layer 80 that correspond to the sidewalls of the stepped parts 60. Thereby, undesired portions of the photosensitive layer 200 may be exposed. For example, portions of the photosensitive layer 200 corresponding to the light shielding pattern 300a may be exposed by the diffused reflected light.

Referring to FIG. 4B, when the photosensitive layer 200 is developed and the undesired portions of the photosensitive layer 200 are exposed by the diffused reflected light, a photosensitive layer pattern 200b having defective sidewalls may be formed. For example, the sidewalls may have uneven surfaces or may be slanted.

Referring to FIG. 4C, if the exposed portions of the metal layer 80 are removed using the photosensitive layer pattern 200b as a mask, sidewalls of a metal line 80b corresponding to the photosensitive layer pattern 200b may have defective shapes. For example, the sidewalls may have uneven surfaces or may be slanted.

In the case where the metal line 80b is designed to have a width of about 2 μm or less, the above-stated defect may increase the resistance of an electrode or line or cause disconnection. Furthermore, because the diffused reflection is irregular, a plurality of metal lines 80b may have a relatively low uniformity.

However, in an exemplary embodiment of the present inventive concept, as shown in FIG. 3C, the organic layer patterns 90 having a relatively low reflectivity are formed on the surfaces of the ramps of the metal layer 80 that correspond to the lower step difference due to the height of each stepped part 60 and the distance between the stepped parts 60.

Referring to FIG. 3D, most light applied to the surfaces of the ramps of the metal layer 80 is absorbed into the organic layer pattern 90, whereby diffused reflection may be prevented. Consequently, as shown in FIG. 3E, the sidewalls of the photosensitive layer pattern 200a may be formed with a shape to prevent defects in the formation of the metal line 80a. For example, sidewalls of the photosensitive layer pattern 200a may have surfaces that are flat and not slanted. As a result, as shown in FIG. 3F, the sidewalls of the metal line 80a may include a shape that is satisfactory and prevents defects such as increased resistance of an electrode or line or disconnection. For example, sidewalls of the metal line 80a may have surfaces that are flat and not slanted.

In the case where each stepped part 60 has a height of about 2000 Å or less or the distance between the stepped parts 60 is about 5 μm or more, the step difference due to the height of each stepped part 60 and the distance between the stepped parts 60 might not be excessively revealed on the surface of the metal layer 80. In this case, there may be less influence from diffused reflection during exposure.

Therefore, exemplary embodiments of the present inventive concept may be effectively applied to a structure in which each stepped part 60 has a height of about 2000 Å or more and the distance between the stepped parts 60 is about 5 μm or less. In addition, exemplary embodiments of the present inventive concept may be effectively applied to a structure in which each metal line 80a is disposed between two adjacent stepped parts 60.

In accordance with exemplary embodiments of the present inventive concept, each metal line 80a designed to have a width of about 2 μm or less may have a satisfactory shape, and a plurality of metal line 80a may become more uniform.

For example, the surface of the second insulating layer 70 may be planarized by increasing the thickness thereof to mitigate the lower step difference. However, in this case, the process time and the production cost may be increased.

In exemplary embodiments of the present inventive concept, because the second insulating layer 70 may have a relatively small thickness, the electrodes or lines having a multilayered structure may be easily firmed without an increase in the process time or the production cost.

As described above, in exemplary embodiments of the present inventive concept, diffused reflection may be prevented from occurring due to a lower step difference during exposure. Thereby, a photosensitive layer pattern may be formed in a satisfactory shape.

In exemplary embodiments of the present inventive concept, an organic layer, which is used in manufacturing a display device, is used to prevent the diffused reflection. Consequently, lines having fine widths may be satisfactorily embodied without increasing the number of manufacturing processes or the production cost. In addition, the uniformity of the lines may be increased.

Exemplary embodiments of the present inventive concept may be used in manufacturing a high-resolution display device.

While the present inventive concept has been described with reference to exemplary embodiments thereof, it will be understood by those of ordinary skill in the art that various changes in form and details may be made thereto without departing from the spirit and scope of the present inventive concept.

What is claimed is:

1. A method of manufacturing a display device, comprising:
    providing a substrate including a first stepped part;
    forming a metal layer on the substrate and the first stepped part;
    forming an organic layer pattern on the metal layer at a position corresponding to a sidewall of the first stepped part;
    forming a photosensitive layer on the metal layer and the organic layer pattern;
    patterning the photosensitive layer to form a photosensitive layer pattern adjacent to the organic layer pattern; and
    forming a metal line by removing the organic layer pattern and an exposed portion of the metal layer through an etching process using the photosensitive layer pattern as a mask.

2. The method of claim 1, wherein the first stepped part has a height of 2000 Å or more.

3. The method of claim 1, further comprising:
    forming an insulating layer on the substrate and the first stepped part; and
    forming the metal layer on the insulating layer.

4. The method of claim 1, wherein the organic layer pattern includes a colored dye or pigment.

5. The method of claim 1, wherein the organic layer pattern has a reflectivity ranging from 1% to 30%.

6. The method of claim 1, wherein the metal line is formed to have a width of 2 μm or less.

7. A method of manufacturing a display device, comprising:
    providing a substrate;
    forming a plurality of patterns on the substrate;
    a plurality of steps is formed on a surface of the substrate, wherein each of the plurality of patterns is spaced apart from each other by a predetermined distance;
    forming a metal layer on the substrate and the plurality of patterns;
    forming a plurality of organic layer patterns on the metal layer at positions corresponding to sidewalls of the plurality of patterns;
    forming a photosensitive layer on the metal layer and the plurality of organic layer patterns;
    patterning the photosensitive layer to form a photosensitive layer pattern between the plurality of organic layer patterns; and
    forming a plurality of metal lines by removing the organic layer patterns and exposed portions of the metal layer through an etching process using the photosensitive layer pattern as a mask.

8. The method of claim 7, wherein each of the plurality of patterns has a height of 2000 Å or more, and the predetermined distance between the plurality of patterns is 5 μm or less.

9. The method of claim 7, further comprising:
    forming an insulating layer on the substrate and the plurality of patterns; and
    forming the metal layer on the insulating layer.

10. The method of claim 7, wherein the organic layer pattern includes a colored dye or pigment.

11. The method of claim 7, wherein the organic layer pattern has a reflectivity ranging from 1% to 30%.

12. The method of claim 7, wherein the metal line is formed to have a width of 2 μm or less.

13. A method of manufacturing a display device, comprising:
    providing a substrate including a plurality of stepped parts, wherein each of the plurality of stepped parts includes sidewalls that are slanted;
    forming a first insulating layer on the substrate and the plurality of stepped parts;
    forming a metal layer on the first insulating layer;
    forming an organic layer pattern on the metal layer, wherein the organic layer pattern overlaps the sidewalls of the plurality of stepped parts that are slanted;
    forming a photosensitive layer on the metal layer;
    patterning the photosensitive layer to form a photosensitive layer pattern and to expose a portion of the metal layer; and
    forming a metal line by removing the organic layer pattern and the exposed portion of the metal layer.

14. The method of claim 13, wherein the plurality of stepped parts includes a first stepped part and a second stepped part adjacent to the first stepped part, and
    the photosensitive layer pattern is formed between the first and second stepped parts.

15. The method of claim 14, wherein the photosensitive layer pattern is formed between sidewalls of the first and second stepped parts that are overlapped by the organic layer pattern.

16. The method of claim 13, wherein the organic layer pattern and the exposed portion of the metal layer are removed through an etching process by using the photosensitive layer pattern as a mask.

17. The method of claim 13, wherein the plurality of stepped parts includes a first stepped part and a second stepped part adjacent to the first stepped part, and the first stepped part and the second stepped are spaced apart from each other by a predetermined distance.

18. The method of claim 17, wherein the predetermined distance between the first stepped part and the second stepped part is 5 μm or less.

19. The method of claim 13, wherein the metal line is formed to have a width of 2 μm or less.

20. The method of claim 13, wherein the organic layer pattern has a reflectivity of 30% or less.

* * * * *